United States Patent
Rinzler et al.

(10) Patent No.: US 8,217,386 B2
(45) Date of Patent: Jul. 10, 2012

(54) SHORT CHANNEL VERTICAL FETS

(75) Inventors: Andrew Gabriel Rinzler, Newberry, FL (US); Zhuangchun Wu, Gainesville, FL (US); Bo Liu, Gainesville, FL (US)

(73) Assignee: University of Florida Research Foundation, Inc., Gainesville, FL (US)

( * ) Notice: Subject to any disclaimer, the term of this patent is extended or adjusted under 35 U.S.C. 154(b) by 393 days.

(21) Appl. No.: 12/305,409

(22) PCT Filed: Jun. 29, 2007

(86) PCT No.: PCT/US2007/072501
§ 371 (c)(1),
(2), (4) Date: Feb. 23, 2009

(87) PCT Pub. No.: WO2008/008648
PCT Pub. Date: Jan. 17, 2008

(65) Prior Publication Data
US 2009/0302310 A1    Dec. 10, 2009

Related U.S. Application Data

(60) Provisional application No. 60/817,521, filed on Jun. 29, 2006.

(51) Int. Cl.
*H01L 51/10* (2006.01)
(52) U.S. Cl. ........... 257/40; 257/328; 257/E51.006; 257/213; 257/413; 257/900; 257/902; 257/903; 257/E21.431; 257/E21.435; 257/E21.619; 257/E39; 257/E51.038
(58) Field of Classification Search .......... 257/40, 257/328, E51.006, 213, 413, 900, 902, 903, 257/E21.431, E21.435, E21.619, E39, E51.038
See application file for complete search history.

(56) References Cited

U.S. PATENT DOCUMENTS
5,210,045 A * 5/1993 Possin et al. ............. 438/158
(Continued)

FOREIGN PATENT DOCUMENTS
WO    WO 2005-091373    9/2005

OTHER PUBLICATIONS

Cao, Q. et al., "Transparent flexible organic thin-film transistors that use printed single-walled carbon nanotube electrodes," *Applied Physics Letters*, Mar. 15, 2006, pp. 113511-1 to 113511-3, vol. 88. No. 11.

(Continued)

*Primary Examiner* — Marc Armand
(74) *Attorney, Agent, or Firm* — Saliwanchik, Lloyd & Eisenschenk

(57) ABSTRACT

A vertical field effect transistor (FET) comprises a gate electrode and a first electrode layer having a dielectric layer interposed between these electrodes and a semiconducting active layer electrically coupled to the first electrode. The active layer and the dielectric layer sandwich at least a portion of the first electrode where at least one portion of the active layer is unshielded by the first electrode such that the unshielded portion is in direct physical contact with the dielectric layer. A second electrode layer is electrically coupled to the active layer where the second electrode is disposed on at least a portion of the unshielded portion of the active layer such that the second electrode can form electrostatic fields with the gate electrode upon biasing in unscreened regions near the first electrode.

18 Claims, 6 Drawing Sheets

U.S. PATENT DOCUMENTS

| | | | |
|---|---|---|---|
| 2002/0173083 A1* | 11/2002 | Avouris et al. | 438/129 |
| 2004/0113152 A1 | 6/2004 | Kim et al. | |
| 2004/0197546 A1 | 10/2004 | Rinzler et al. | |
| 2005/0206300 A1* | 9/2005 | Perlo et al. | 313/498 |
| 2006/0065887 A1* | 3/2006 | Tiano et al. | 257/20 |
| 2006/0081882 A1* | 4/2006 | Malenfant et al. | 257/203 |
| 2007/0012922 A1* | 1/2007 | Harada et al. | 257/66 |
| 2007/0138462 A1* | 6/2007 | Street et al. | 257/40 |

OTHER PUBLICATIONS

Di, C. et al., "Noncoplanar organic field-effect transistor based on copper phthalocyanine," *Applied Physics Letters*, Mar. 21, 2006, pp. 121907-1 to 121907-3, vol. 88, No. 12.

Qi, P. et al., "Miniature Organic Transistors with Carbon Nanotubes as Quasi-One-Dimensional Electrodes," *Journal of the American Chemical Society*, Jan. 9, 2004, pp. 11774-11775, vol. 126, No. 38.

\* cited by examiner

*(Not the Invention)*

SHORT CHANNEL VERTICAL FETS

CROSS-REFERENCE TO RELATED APPLICATIONS

The present application is the U.S. National Stage Application of International Patent Application No. PCT/US2007/072501, filed on Jun. 29, 2007, which claims the benefit of U.S. Provisional Application Ser. No. 60/817,521, filed Jun. 29, 2006, both of which are hereby incorporated by reference herein in their entirety, including any figures, tables, or drawings.

FIELD OF THE INVENTION

This invention relates to the field of short channel field effect transistors (FETs).

BACKGROUND

Organic molecule based field effect transistors (FETs) have been a subject of intense research efforts over the last decade. The popularity regarding these FETs is primarily because these devices are generally fabricated using lower cost capital equipment, and lower temperatures as compared to traditional silicon based transistors. However, organic FETs are not necessarily useful in high performance computing or very high speed applications (in the near term), but are expected rather to replace silicon in high volume applications where very small size/speed is not required, but cost is an issue. Examples include the switching transistor drivers for each pixel in the back planes of LCDs and electroluminescent displays and in radio frequency identification tags (RFIDs). Organic FETs thus provide the promise of cheap, transparent, flexible electronics. However, organic FETs are plagued by a low mobility of charge carriers that limit performance. The low mobility requires a larger source-drain voltage to drive the currents needed, which translates into higher power consumption.

The performance of a FET is generally characterized by the mobility ($\mu$) of the carriers in the active channel, the current ratio between the on/off states and the subthreshold slope, which specifies the gate voltage needed to switch between the on/off states. High values of $\mu$(>about 0.1 cm$^2$/Vs) and on/off ratios (>10$^6$) and low subthreshold slopes (<500 mV/decade) are desirable for practical application of FETs in circuits. The mobility of organic semiconductors is dependent on the degree to which the charge-accepting orbitals of neighboring molecules overlap. In contrast to inorganic semiconductors, such as Si where charges move within a three-dimensional covalent network, organic semiconductors rely upon weak van der Waals interactions between discrete molecular constituents and charge transport relies on intermolecular hopping. The mobility in organic semiconductors increases with improved crystallinity, however even perfectly ordered organic semiconductor crystals have much lower mobilities than covalently bonded crystalline semiconductors. One way to overcome the limitation imposed by this intrinsically lower mobility is to make the distance the charges must travel small, that is, to make the channel length between the source and drain terminals short.

The term "organic semiconductors" is used to describe molecular organic solids in the form of a bulk layer or Elm, which possess the ability of transporting charge. The electrical conductivity of these materials lies between that of metals and insulators, spanning a broad range of 10$^{-9}$ to 10$^3$/ohm-cm. Depending on the specific organic molecules, the intentional or incidental doping and/or the contact electrode materials used, that conductivity can occur via electrons near the bottom of the conduction band (n-type conductivity) or holes near the top of a valence band (p-type conductivity). Pentacene is an exemplary organic semiconductor that is commercially available or can be readily synthesized in the laboratory. Most FETs fabricated with pentacenes exhibit p-type conductivity.

A cross-sectional schematic of a standard organic molecule p-type FET (PFET) 100 configuration is shown in FIG. 1. FET 100 includes a p-doped back gate 101, dielectric layer 102, drain metal electrode 105, an organic semiconductor layer 103, such as a pentacene layer, and source metal electrode 104. In a typical fabrication of such a device the source and drain electrodes are formed on the gate dielectric layer followed by deposition of the pentacene layer (so called "bottom contacts"), however, other constructs are also common. For example, the organic molecule layer can be deposited onto the gate dielectric followed by formation of the source/drain electrodes (so called "top contacts"). There are also top gate constructs in which the dielectric layer may be deposited on top of the organic semiconductor layer, followed by the deposition of a gate electrode. As known to those skilled in the art, because of the symmetry between the source and drain electrodes, the source and drain can interchange roles for operation of the transistor with no change in the device performance.

Referring again to FIG. 1, the cross-sectional view provided is a slice through the device, perpendicular to the long axis of the electrodes, which extends for a length greater than their width into the page. The channel length of the device is the distance between the source 104 and drain 105 electrodes indicated in FIG. 1 by CL. In operation a small fixed voltage is applied between the source 104 and drain 105 electrodes. Modulation of the gate voltage (Vg) controls the carrier concentration in the channel region and as a result the source-drain electrode current. For a p-type silicon back gate 101 and large work function metal source-drain electrodes (e.g. Pd) the positive potential on the source 104 and drain 105 electrodes, relative to the negative gate 101, draws electrons out of the normally filled, highest occupied molecular orbitals (HOMOs) of the pentacene or other organic semiconducting active layer 103 resulting in an increase of the hole carriers shown as + + + + charges in FIG. 1. The resulting increased hole carrier density in the pentacene or other organic semiconducting layer results in the increased source drain current that turns the transistor on. A positive gate ($V_G$>0) potential fills the HOMOs, minimizing the hole carrier density, turning the transistor off.

Short channel lengths improve organic molecule based transistor performance. However, fabricating channel lengths of the order of 100 nm or less for the configuration shown in FIG. 1 is technologically challenging, particularly for mass production.

SUMMARY OF THE INVENTION

A vertical field effect transistor (FET) is in the form of a stack where a dielectric layer is interposed between a gate electrode and a first electrode layer that is coupled to a semiconducting active layer such that the active layer and dielectric layer sandwich at least a portion the first electrode layer. The active layer extends beyond an area of the first electrode layer to form at least one unshielded active portion that is in direct physical contact with the dielectric layer. A second electrode layer disposed on at least a portion of the unshielded portion of the active layer to which it is electrically coupled.

The gate electrode can either be a back gate where the dielectric layer is disposed on top of the gate or a top gate with the dielectric layer disposed beneath the top gate.

The first electrode layer can be a dilute percolating carbon nanotube containing film, preferably single walled nanotubes (SWNTs). Alternately, the first electrode can be a dilute percolating Si or other semiconducting nanowire containing film rather than a carbon nanotube film, and can be a thin layer of microlithographically patterned metallic electrodes. The second electrode layer is preferably a nanotube containing film. The second electrode can alternately be a contiguous metallic film, a semiconducting film or a semiconducting nanowire film.

The active layer can be an organic semiconductor selected from the group of: (1) at least one kind of linearly condensed polycyclic aromatic compound selected from the group of naphthalene, anthracene, tetracene, pentacene, hexacene, and their derivatives; (2) at least one kind of pigment selected from the group of copper-phthalocyanine(CuPc)-based compounds, azo compounds, perylene-based compounds, and their derivatives; (3) at least one kind of low-molecular compound selected from the group of hydrazone compounds, triphenyl methane-based compounds, diphenylmethane-based compounds, stilbene-based compounds, arylvinyl compounds, pyrazoline-based compounds, triphenyl amine derivatives (TPD), arylamine compounds, low-molecular weight arylamine derivatives (α-NPD), 2,2',7,7'-tetrakis (diphenylamino)-9,9'-spirobifluorene (Spiro-TAD), N,N'-di (1-naphthyl)-N,N'-diphenyl-4,4'-diamonobiphenyl (Spiro-NPB), 4,4',4''-tris[N-3-methylphenyl-N-phenylamino]-triphenylamine (mMTDATA), 2,2',7,7'-tetrakis(2,2-diphenylvinyl)-9,9-spirobifluorene (Spiro-DPVBi), 4,4'-bis (2,2-diphenylvinyl)biphenyl (DPVBi), (8-quininolinolato) aluminum (Alq), tris(8-quinolinolato)aluminum ($Alq_3$), tris (4-methyl-8quinolinolato)aluminum ($Almq_3$), and derivatives thereof; and (4) at least one kind of polymer compound selected from the group of poly(p-phenylenevinylene) (PPV), polymers containing biphenyl groups, polymers having dialkoxy groups, alkoxyphenyl-PPV, phenyl-PPV, phenyl/dialkoxy-PPV copolymer, poly(2-methoxy-5-(2'-ethylhexyloxy)-1,4-phenylenevinylene) (MEH-PPV), poly(ethylenedioxythiophene) (PEDOT), poly(styrene-sulfonic acid) (PSS), poly(aniline) (PANI), poly(N-vinylcarbazole), halogenated poly(N-vinylcarbazole), poly(vinylpyrene), poly(vinylanthracene), pyrene-folmaldehyde resin, ethylcarbazole-folmaldehyde resin, and modified variations of these polymers. The semiconducting active layer can be amorphous silicon or polysilicon and doped or undoped.

The FET can be constructed from optically transparent gate, first, and second electrodes with an optically transparent dielectric layer. The first and second electrodes can be individual nanotubes directly contacted by metal electrodes to form a minimal size transistor element. All layers of the FET can be flexible and can be supported by a flexible substrate.

BRIEF DESCRIPTION OF THE DRAWINGS

A fuller understanding of the present invention and the features and benefits thereof will be accomplished upon review of the following detailed description together with the accompanying drawings, in which.

DETAILED DESCRIPTION OF THE INVENTION

Figure 1:
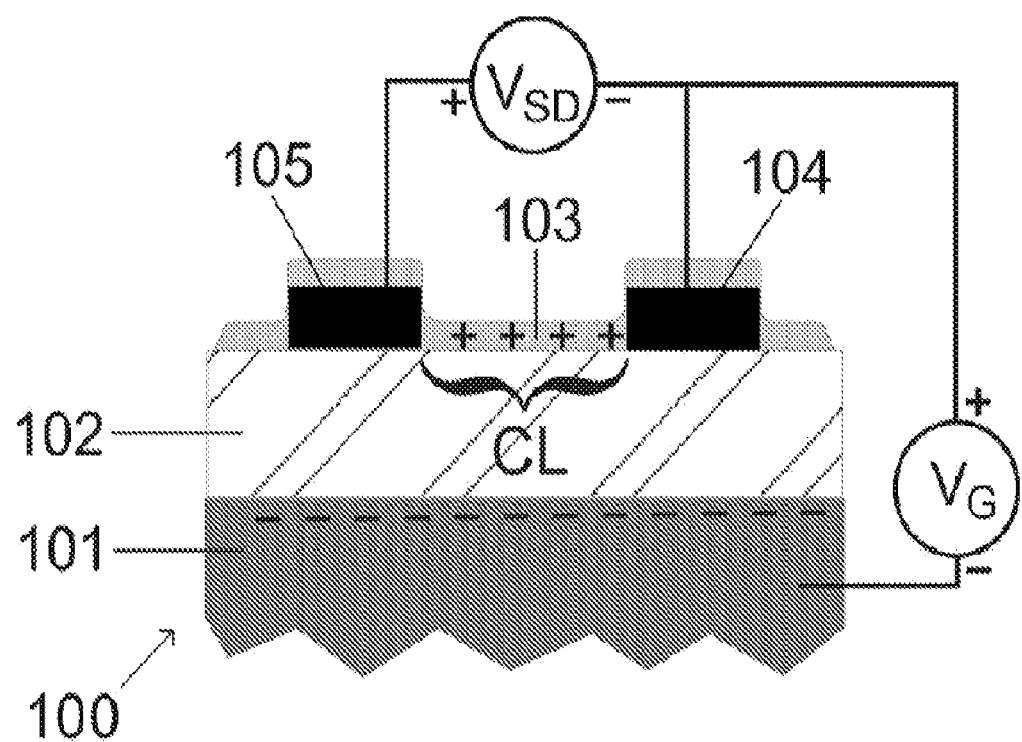
FIG. 1 is a cross-sectional schematic of a standard organic molecule PFET configuration.

A vertical field effect transistor (FET) comprises a stack comprising a gate electrode and a first electrode layer having a dielectric layer interposed therebetween. A semiconducting active layer is electrically coupled to the first electrode. The active layer together with the dielectric layer sandwich at least a portion the first electrode, wherein the active layer extends beyond an area of the first electrode to form at least one unshielded active portion, the unshielded portion being in direct physical contact with the dielectric layer. A second electrode layer is electrically coupled to the active layer, wherein the second electrode is disposed on at least a portion of the unshielded portion of the active layer. Regions of the second electrode can thus form electrostatic fields with the gate electrode upon biasing in regions near, but not screened, by the first electrode.

As used herein, "sandwiching" refers to full coverage of the top of the first electrode (or bottom when the gate is the top layer in the stack). In a preferred embodiment, the sandwiching includes coverage along the sides of the first electrode so that together with the dielectric layer a portion (e.g. the length except for the end used for contacts) of the first electrode is fully encapsulated.

FETs according to the invention are thin film transistors that permit nanometer scale control over the active layer thickness which defines the channel length between the source and drain terminals. The new gate arrangement according to the invention is preferably facilitated by the properties of quasi-one dimensional, low carrier density, source and drain electrodes provided by carbon nanotubes, hereafter referred to as nanotubes, the nanotubes can be single wall carbon nanotubes (SWNTs), multi wall nanotubes (MWNTs), or a mixture thereof. This construction results in greatly improved performance from organic molecule active layers that possess intrinsically poor on-state conductance because of mobility limiting, weak intermolecular electronic coupling. Conventional semiconductor active layers, such as Si based, may also benefit from the short channel lengths and novel construction.

An exemplary back gate device construction is first presented. The device begins with a substrate comprising a dielectric layer disposed on an electrically conducting or semiconducting layer. For example, the dielectric can comprise a $SiO_x$ layer and the substrate a p-doped silicon substrate (wafer). On top of the dielectric layer lies a dilute, but electrically percolating, film of nanotubes, preferably being primarily SWNTs, and most preferably consisting essentially of SWNTs. As used herein, "dilute" refers to a nanotube film having substantial regions of the substrate not covered by nanotubes and there exist appreciable lengths of nanotubes and thin nanotube bundles that do not have other nanotubes that are associated with this layer crossing either above or below them, while "percolating" refers to a nanotube layer having a density of nanotubes (i.e. nanotubes/unit area) sufficient to provide electrical continuity from one end of the layer to the other. This percolating nanotube film can be grown directly onto the dielectric layer or deposited by any suitable method. The nanotube film is electrically contacted by a narrow line of metallization that provides electrical contact to one or more edges of the nanotube film. The choice of metallization is dictated by whether the desired transistor is to be an NFET or a PFET. The present exemplary embodiment concerns an enhancement mode PFET employing palladiun as the metallization contact. This electrically percolating nanotube film, addressed electrically by the metal contact, constitutes the transistor source electrode.

The semiconductor active layer is now deposited directly onto the dielectric layer, on top of the dilute and percolating nanotube film by a thin film deposition technique such as evaporation, sputtering, electrochemical deposition or other means that provides fine control over the active layer thickness. One active layer is pentacene, which is an example of a linear fused ring compound, typically deposited by thermal evaporation. Pentacene is known to have the highest thin film mobility among organic semiconductors and also a high single crystal mobility of about 2 $cm^2/Vs$ (at 25 C), which makes it a widely studied organic semiconductor for FETs.

The active layer can be as thin as a single molecular layer or hundreds of nanometers thick (e.g. 500 nm), or any thickness in between, with thickness control provided by the deposition parameters. The pentacene or other organic semiconducting layer need not cover the dielectric layer contiguously so long as it coats substantially all the nanotube film of the source electrode. The substrate can be heated during the deposition to enhance the crystallinity of the pentacene or other organic semiconducting layer. Alternatively, the device can be subjected to a post evaporation heating cycle to improve the crystallinity of the pentacene or other organic semiconducting layer. Significantly, the thickness of the pentacene or other organic semiconducting layer coating the source nanotube film defines the channel length of the device.

The drain electrode can be a thin Pd metallization or another nanotube film deposited directly on top of the pentacene or other organic semiconducting layer. If a nanotube film is used, the drain electrode should typically have more nanotubes per unit area in the nanotube film than the dilute source nanotube film. The electrical contact to this drain nanotube film can be made by a narrow palladium contact along one or more edges of the drain nanotube film. A final thermal anneal (below the sublimation temperature of pentacene or other organic semiconductor) may provide benefit to the device performance.

Figure 2:
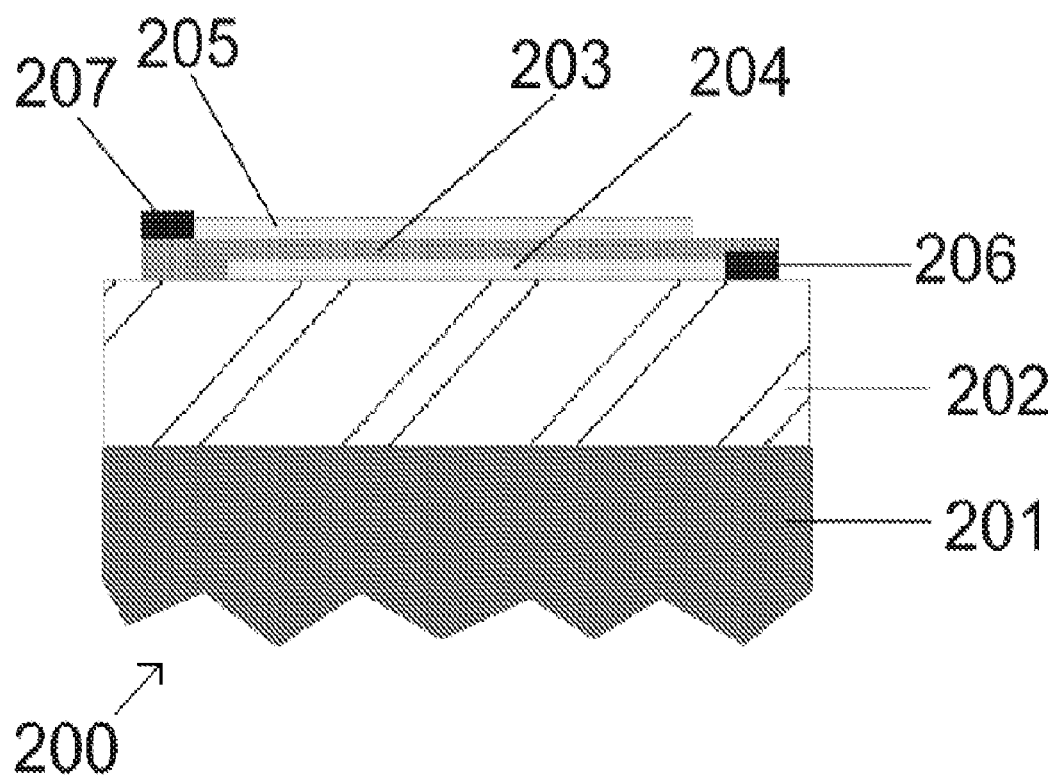
FIG. 2 is a cross-sectional schematic of an exemplary vertical PFET according to the invention.

FIG. 2 is a cross-sectional schematic of an exemplary vertical back gate PFET 200 according to the invention. PFET 200 includes a p-doped back gate 201, a dielectric layer 202, a source electrode comprising a metal contact 206 and a dilute and percolating nanotube film 204, an organic semiconductor (e.g. pentacene) active layer 203, and a drain electrode comprising a nanotube film 205 or a Pd layer, which in the case that a nanotube film is used as a metallization contact 207 to the nanotube film. In operation, for a fixed, small voltage applied between the source-nanotube-film 204 and drain film 205 or layer the source-film to drain-layer current is controlled by a voltage applied between the p-doped back gate 201 and the drain 205.

In a preferred embodiment, a nanotube film 205 is used with a metallization contact 207 as the drain electrode. In this embodiment each crossing of an individual drain film nanotube (or nanotube bundle) lying directly above an individual source film nanotube (or thin nanotube bundle) with an active layer 203 material such as pentacene or other organic semiconductor interposed between them, along with the underlying back gate, constitutes an individual transistor element (see FIG. 3). In a device consisting of numerous such nanotube crossings over a common back gate 301, the transistor elements work in parallel, with the net current through the source 304 and drain 305 electrodes dictated by the area of overlap between the back gate and the source-drain films. The larger this area the greater the number of individual transistor elements contributing to the current.

To describe the operation of a single transistor-element (shown schematically in FIG. 3) an individual source nanotube (304 in FIG. 3, oriented out of the page) lying on the back gate dielectric 302 and p-doped gate electrode 301 is considered herein. This nanotube is contacted on one or both ends by other nanotubes within the dilute and percolating source network (not shown). This nanotube is coated with the thin pentacene or other organic semiconducting layer 303. An individual drain nanotube 305, contacted on one or both ends by other nanotubes within the drain network (not shown) lies on top of the pentacene or other organic semiconducting layer, across the first nanotube. The flexibility of the nanotubes allows the source nanotube to conform to the pentacene or other organic semiconducting layer 303, hence the curvature observed in the drain nanotube 305 shown in the FIG. 3. As all source nanotubes 304 constitute first electrodes, any area of the pentacene or other organic semiconducting active layer 303 present in the spaces between the nanotubes 304 constitute unshielded portions of the active layer 303.

Figure 3:
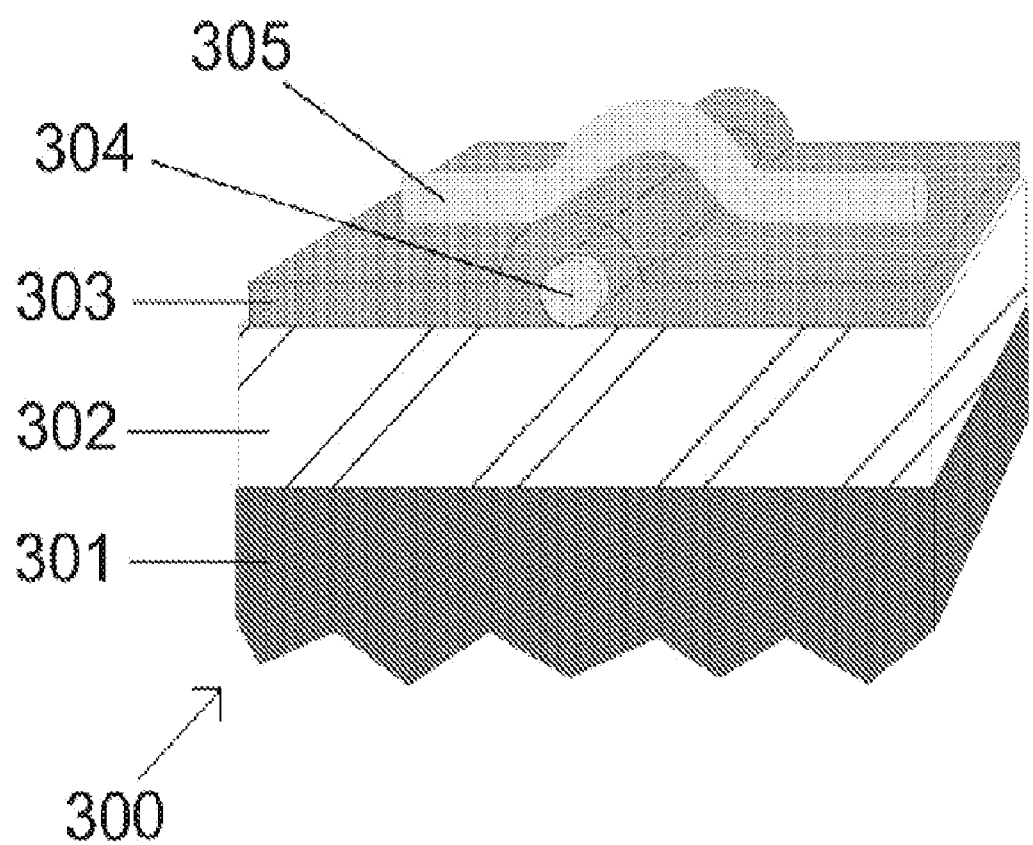
FIG. 3 is a schematic of a single sub-transistor element comprising an individual source nanotube lying on the back gate dielectric.

The operation of this minimal size element is now described. For clarity the source and drain nanotubes are considered to lie perpendicular to each other (as illustrated in FIG. 3), however, source nanotubes can cross drain nanotubes at any angle. It is also noted that rather than existing as part of larger nanotube networks the two nanotubes can be directly contacted each with a separate metal contact to form the limiting case of a single transistor.

Figure 4:
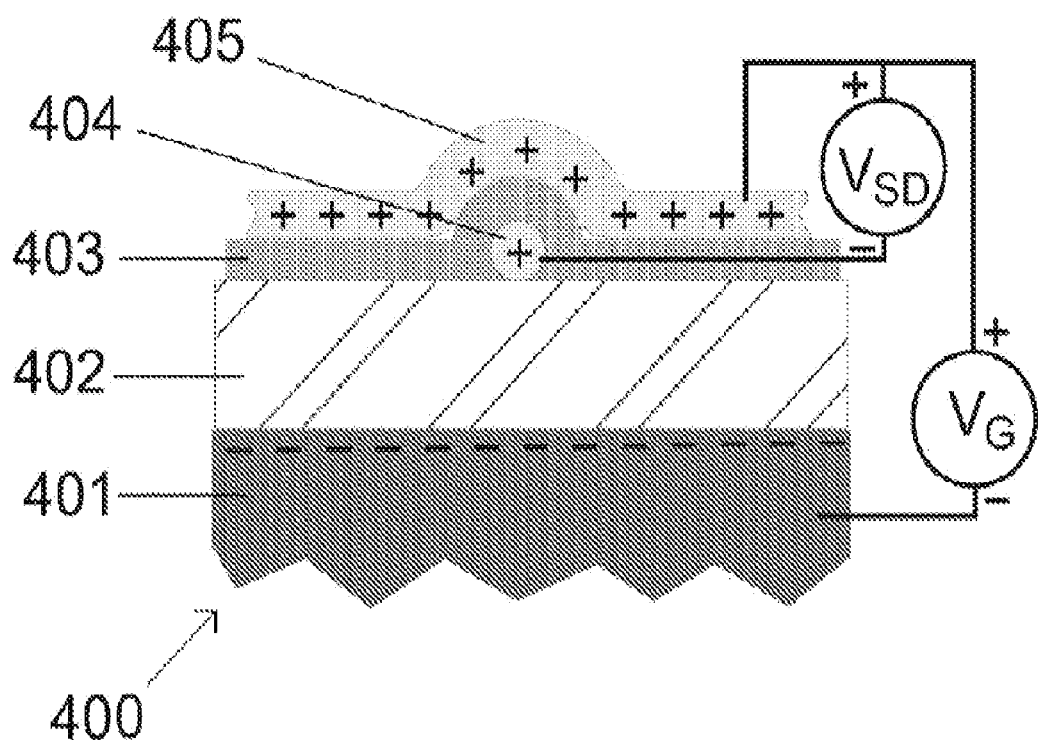
FIG. 4 illustrates electrical operation of a PFET device according to the invention during normal operation.

FIG. 4 shows a bias arrangement for a PFET device according to the invention during normal operation. A small constant voltage, such as 200 mV, is applied between the source and drain nanotubes, 404 and 405 ($V_{SD}$), with the drain side positive relative to the source side. Prior to the application of this gate voltage the highest occupied molecular orbitals (HOMOs) of the pentacene or other organic semiconducting molecules are presumed filled and the lowest unoccupied molecular orbitals (LUMOs) are presumed empty. The Fermi levels of the nanotubes (in contact with the Pd metal) lie well below the pentacene or other organic semiconductor LUMO band yielding large barriers to charge injection into the LUMO band, while the pentacene or other organic semiconductor HOMO band, because it is filled, permits no hole transport through it. Consequently, prior to application of the gate voltage, charge transport through the pentacene or other organic semiconducting layer is very low (the transistor is off).

FIG. 4 shows the circumstance when the transistor is on, which occurs when the back gate voltage ($V_G$) is made sufficiently negative with respect to the source and drain. The resulting positive charging of the nanotubes, 404 and 405, relative to the gate 401 results in a depression of their Fermi levels, bringing with them the Fermi level of the pentacene or other organic semiconducting layer 403. Electrons are withdrawn from the pentacene or other organic semiconductor HOMOs generating mobile charge carriers (holes) in the HOMO band which now respond to $V_{SD}$ to provide the source-drain current. The transistor thus turns on. To turn the transistor off again the gate voltage with respect to the nanotube source 404 and drain 405 is made positive, injecting electrons into the pentacene or other organic semiconducting layer 403, filling the holes in the HOMO band. For clarity this description assumed that the FET is off (very low source-drain current) at zero and positive gate voltages and the FET turns on with negative gate voltages. However it should be recognized that the threshold gate voltage at which the device turns on/off depends upon several factors including the metal contact materials, the gate 401 material as well as intentional or incidental doping of the nanotubes 404 and/or 405 and the pentacene or other organic semiconducting layer 403, and is likely to occur at gate voltages different from zero.

Figure 5:
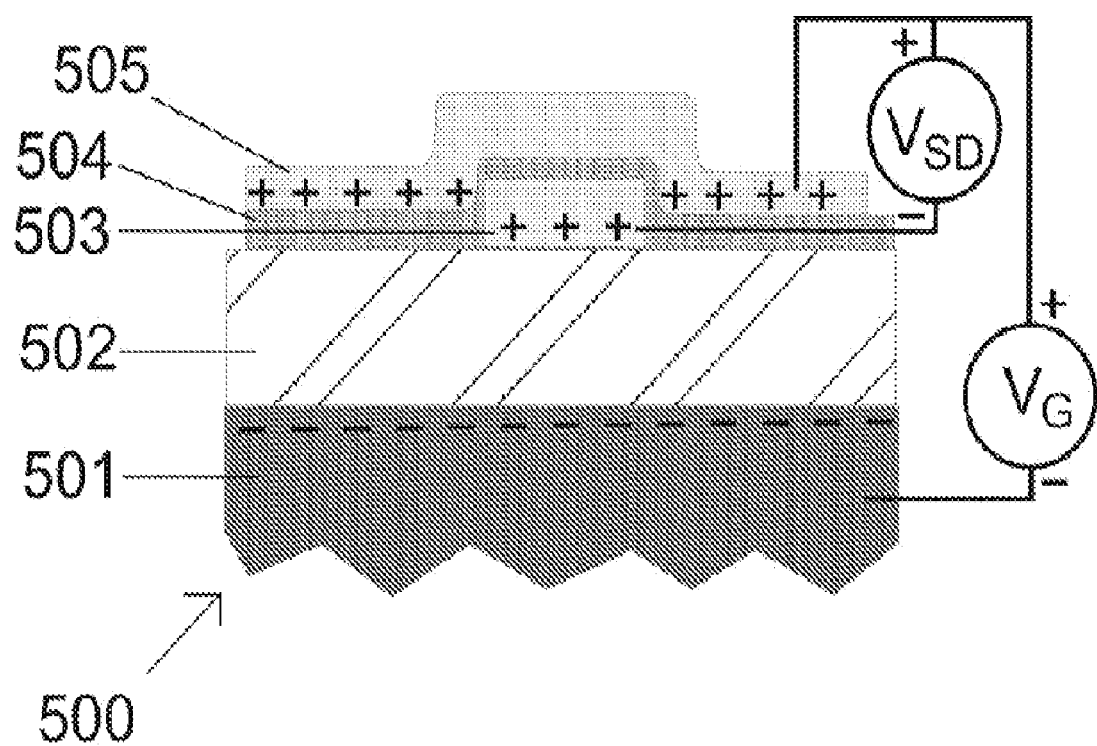
FIG. 5 illustrates a PFET device not of the present invention but of similar construction to PFET 400 shown in FIG. 4, made with only metal electrodes, used to describe the limitations imposed by a high carrier density material (e.g. metal) used for the source or drain electrodes.
Figure 6:
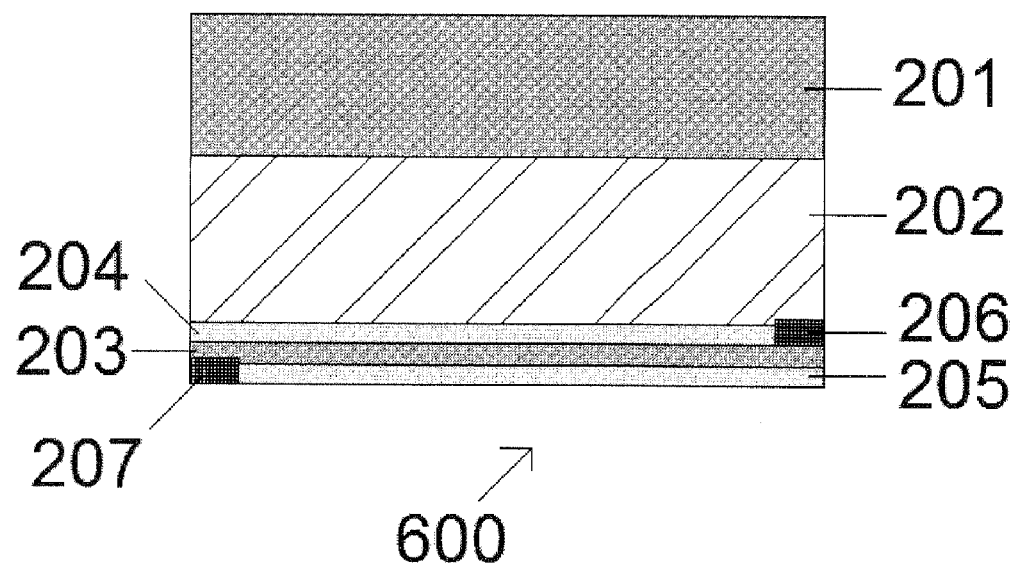
FIG. 6 is a cross-sectional schematic of an exemplary vertical PFET (600) having a top gate according to the invention where numbering reflect the equivalent feature of FIG. 2 for the exemplary vertical PFET (200) having a back gate.

To better appreciated how the quasi-one-dimensional nature of the nanotubes and the low carrier density of nanotubes contributes to the performance of this device it is instructive to consider the problems associated with a superficially similar device. Referring now to PFET 500 (not the invention) shown in FIG. 5, 501 and 502 are the p-doped silicon back gate and $SiO_X$ dielectric layers, respectively, 504 is a patterned, metal, thin film, source electrode having a width of ~100 nm and longer length going into the page, 503 is the pentacene or other organic semiconducting layer and 505 is a metal, thin film, drain electrode lying across the source electrode 504. For PFET 500 the source-drain current will be modified less than the nanotube based device for excursions of the gate voltage with respect to the drain ($V_G$), i.e. PFET 500 will provide poor performance compared to PFET 400 shown in FIG. 4. The reason for the degraded performance is that the high carrier density of the metal electrodes fully screens the charge accumulation from where it is most needed: at the metal electrode, 504 and 505, surfaces where they contact the pentacene or other organic semiconducting layer 503 between the source 504 and drain 505. The charge accumulated on the bottom of the source electrode 504, nearest the back gate 501, efficiently screens both the top of this electrode that is in contact with the pentacene or other organic semiconducting layer 503, as well as the bottom of the drain electrode 505 above it. Because of this screening the charge accumulation at the surface of the pentacene or other organic semiconductor between the two electrodes where the channel length (pentacene or other organic semiconductor thickness) is minimum, responds negligibly to the gate voltage swings, resulting in negligible change induced in the pentacene or other organic semiconductor carrier density there. This screening is not as effective near the edges of the patterned metal source electrode so the device can still flnction as a transistor (with the active pentacene or other organic semiconductor region being that near the edge of the source electrode).

However, for useful operation, such a device must use an active channel material that does not possess carriers in the absence of a gate voltage (i.e. operates in the so called enhancement mode). If this condition is not met, the screened region, which does not experience the gate field, can not be switched off.

A metal source electrode based device such as PFET 500 (not the invention) shown in FIG. 5 will require substantially larger gate voltage swings between the on/off current levels compared to a nanotube based device PFET 200 shown in FIG. 2 according to a preferred embodiment of the invention. For the nanotube based device, the low carrier density of the nanotubes and the nanoscale width of the source nanotube results in very little screening of the drain nanotube film 205 above and near the source nanotube film 204. This low level of electrostatic screening allows the active layer 203 above the source nanotube film 204 to experience the gate field. Another advantage of nanotubes for both the source nanotube film 204 and optional drain nanotube film 205 according to the invention is that the lack of dangling bonds on the nanotube surfaces minimizes so-called Fermi level pinning. For metal electrodes, as in PFET 500, dangling bonds result in barriers to transport across the metal-organic semiconductor (e.g. pentacene or other organic semiconductor) junctions that are relatively insensitive to the work fuinctions of the particular metals used (so called metal induced gap states). Applied voltages predominantly thin or thicken the width of tunneling barriers, while the barrier heights remain largely fixed. For nanotube electrodes, the lack of dangling bonds and the low carrier density allows the direct modulation of barrier heights, enhancing the charge injection, by the applied potentials.

The nanotube based devices provide yet another advantage deriving from the existence of both metallic and semiconducting nanotubes in the source and drain nanotube films. The carrier density of the semiconducting nanotubes is also modified by the applied gate voltage, hence the off state current of the transistor is further suppressed by the lowered carrier concentration of the semiconducting nanotubes under negative gate voltage.

As alternatives to the preferred carbon nanotubes, a dilute network of any conducting or doped semiconducting nanowires can be used as the dilute percolating film directly contacting the dielectric layer. Examples of such nanowires include silver nanowires and doped silicon nanowires.

Although the active layer has been described using pentacene other organic semiconductors and mixtures of organic semiconductors can be used as the active layer. The organic semiconductor can be other linearly condensed polycyclic aromatic compound such as naphthalene, anthracene, tetracene, hexacene, and derivatives of these and pentacene. Alternatively pigment such as copper-phthalocyanine (CuPc)-based compounds, azo compounds, perylene-based compounds, and derivatives of these pigments can be used as the active layer. The active layer can be other low-molecular compounds such as hydrazone compounds, triphenyl methane-based compounds, diphenylmethane-based compounds, stilbene-based compounds, arylvinyl compounds, pyrazoline-based compounds, triphenyl amine derivatives (TPD), (α-NPD), 2,2',7,7'-tetrakis(diphenylamino)-9,9'-spirobifluorene (Spiro-TAD), N,N'-di(1-naphthyl)-N,N'-diphenyl-4,4'-diamonobiphenyl (Spiro-NPB), 4,4',4"-tris[N-3-methylphenyl-N-phenylamino]-triphenylamine (mMTDATA), 2,2',7,7'-tetrakis(2,2-diphenylvinyl)-9,9-spirobifluorene (Spiro-DPVBi), 4,4'-bis(2,2-diphenylvinyl)biphenyl (DPVBi), (8-quininolinolato)aluminum (Alq), tris(8-quinolinolato)aluminum ($Alq_3$), tris(4-methyl-8quinolinolato)aluminum ($Almq_3$), and derivatives of these compounds. The active layer can also be polymeric compounds such as poly(p-phenylenevinylene) (PPV), polymers containing biphenyl groups, polymers having dialkoxy groups, alkoxyphenyl-PPV, phenyl-PPV, phenyl/dialkoxy-PPV copolymer, poly(2-methoxy-5-(2'-ethylhexyloxy)-1,4-phenylenevinylene) (MEH-PPV), poly(ethylenedioxythiophene) (PEDOT), poly (styrenesulfonic acid) (PSS), poly(aniline) (PANI), poly(N-vinylcarbazole), halogenated poly(N-vinylcarbazole), poly (vinylpyrene), poly(vinylanthracene), pyrene-folmaldehyde resin, ethylcarbazole-folmaldehyde resin, and modified polymers of these types.

A problem with the transistor consisting of a single source and a single, perpendicularly oriented drain nanotube (as depicted in FIG. 3) is the small area of overlap defined by the region of minimum channel length between the two. For example, if each nanotube has a 1 nm diameter the area of this overlap is a few nm². This will limit the current through such a single transistor. By making the drain nanotube film dense with nanotubes the source nanotube is overlapped by many drain film nanotubes, increasing the net, active, overlap area between the source and drain, resulting in far greater device current. This also holds when a contiguous Pd layer is used as the drain layer. The current can also be increased for a single drain nanotube by orienting the drain nanotube so that it lies parallel to the source nanotube, thereby increasing the active area between them. Ideally, the drain nanotube would not lie directly above the source nanotube but rather to one or the other side of the source nanotube, minimizing the limited but still finite screening of the gate field by the source nanotube.

The device arrangement described herein can be embodied as transparent transistors. Rather than a silicon back gate, the back gate can easily be made optically transparent, such as by using indium tin oxide, or a thin transparent SWAT film deposited on glass. The back gate can then be covered by an optically transparent dielectric layer followed by the dilute, percolating, SWNT source film and pentacene or other organic semiconductor layer. For transparency, a (thin) SWNT layer can be used for the drain. The device arrangement described is also amenable to the fabrication of flexible transistors requiring that SWNT films be used for the source, drain and gate layers with a flexible dielectric layer, constructed on a flexible substrate.

The use of a SWNT layer deposited on top of pentacene or other organic semiconductor requires some additional considerations. Because of the high growth temperature of the nanotubes compared to the (much lower) sublimation temperature of pentacene or other organic semiconductor it is generally not possible to grow the drain nanotube layer directly on top of the pentacene or other organic semiconductor layer. Instead the nanotubes must be deposited on the pentacene or other organic semiconductor. This can be done by spray coating or by the transfer methods disclosed in Published U.S. Application No. 20040197546 entitled "Transparent electrodes from single wall carbon nanotubes" to Rinzler et al. Rinzler et al. discloses a low temperature method of forming substantially optically transparent and electrically conductive single wall nanotube (SWNT) films.

Rinzler et al. discloses uniformly suspending SWNTs in solution generally aided by a stabilizing agent (e.g. surfactant) followed by the deposition of the nanotubes onto the surface of a porous filtration membrane that possesses a high density of pores that are too small for the majority of the SWNTs to pass through. The nanotube film forms as an interconnected and uniform layer having the SWNTs generally lying on and being parallel to the membrane surface as the liquid is filtered away.

In one embodiment, the solution is vacuum filtered such that a SWNT film is formed on a filter membrane surface. Any surface stabilizing agent present on the SWNTs can be subsequently washed away and the film can then be allowed to dry. Significantly, the removal of the stabilizing agents used to suspend the nanotubes permits the nanotubes to achieve intimate contact with each other (consolidate) throughout the body of the SWNT film. The nanotube film formed in this manner has one side intimately attached to the filtration membrane while the other side is uncoated. To make use of the film, it is generally necessary for the film be transferred to the desired substrate and to remove the membrane. This is accomplished by first adhering the free side of the nanotube film to the clean, desired substrate e.g. by pressure, followed by dissolution of the filtration membrane in a solvent.

The crystallinity of pentacene is known to be modified on exposure to organic solvents, degrading its transistor performance. To avoid this problem, the methods disclosed in Rinzler et al. employing acetone are used to first transfer the drain nanotube film to a water soluble (but acetone insoluble) thin polyvinyl alcohol (PVA) based substrate. This nanotube film is subsequently transferred to the pentacene or other organic semiconductor layer using water (which does not impact the pentacene or other organic semiconductor crystallinity) to dissolve the PVA.

The device described above has been based on a back gate construction, however, as noted above, a top gate construction can also be employed. Other gate dielectrics besides $SiO_X$ discussed in the example provided above can be used. Also, while the choice of which layer constitutes the source and drain were specified above (with the choice made in a manner to maximize the efficiency of the device) these could be switched, still allowing the device to function.

Finally, the description above has been based on a PFET, however with appropriate choice of contact metals, gate material and organic molecule or semiconductor active layer, NFETs can also be realized. For example, naphthalene dianhydride which has been shown to possess electron acceptor properties by electrochemical measurements, is a generally suitable active material for NFETs.

Products from the invention include transparent transistors, high current transistors, and flexible transistors, and combinations thereof. Integrated circuits can be based on transistors according to the invention.

It is to be understood that while the invention has been described in conjunction with the preferred specific embodiments thereof, that the foregoing description as well as the examples which follow are intended to illustrate and not limit the scope of the invention. Other aspects, advantages and modifications within the scope of the invention will be apparent to those skilled in the art to which the invention pertains.

We claim:

1. A vertical field effect transistor (FET), comprising:
a stack comprising a gate electrode and a first electrode layer having a dielectric layer interposed therebetween, said first electrode is dilute and electrically percolating; and
a semiconducting active layer electrically coupled to said first electrode, said active layer together with said dielectric layer sandwiching at least a portion of said first electrode, said active layer extending beyond an area of said first electrode to form at least one unshielded active portion, said unshielded portion in direct physical contact with said dielectric layer; a second electrode layer electrically coupled to said active layer, wherein said second electrode is disposed on at least a portion of said unshielded portion of said active layer.

2. The FET of claim 1, wherein said first electrode is a dilute but percolating nanotubes comprising layer.

3. The FET of claim 1, wherein said gate comprises a back gate, wherein said dielectric layer is disposed on top of said gate electrode.

4. The FET of claim 1, wherein said gate comprises a top gate, wherein said dielectric layer is disposed beneath said gate electrode.

5. The FET of claim 1, wherein said first electrode comprises a dilute but electrically percolating plurality of conducting nanowires or doped semiconducting nanowires.

6. The FET of claim 1, wherein said second electrode layer comprises a nanotubes comprising layer.

7. The FET of claim 1, wherein said active layer is an organic semiconductor selected from the group consisting of:

(1) at least one kind of linearly condensed polycyclic aromatic compound (acene compound) selected from the group consisting of naphthalene, anthracene, tetracene, pentacene, hexacene, and derivatives thereof; (2) at least one kind of pigment selected from the group consisting of copper-phthalocyanine (CuPc)-based compounds, azo compounds, perylene-based compounds, and derivatives thereof; (3) at least one kind of low-molecular compound selected from the group consisting of hydrazone compounds, triphenyl methane-based compounds, diphenylmethane-based compounds, stilbene-based compounds, arylvinyl compounds, pyrazoline-based compounds, triphenyl amine derivatives (TPD), arylamine compounds, low-molecular weight arylamine derivatives ($\alpha$-NPD), 2,2\7,7'-tetrakis(diphenylamino)-9,9'-spirobifluorene (Spiro-TAD), N,N'-di(1-naphthyl)-N,N'-diphenyl-4,4'-diamonobiphenyl (Spiro-NPB), 4,4',4''-tris[N-3-methylphenylN-phenylamino]-triphenylamine (mMTDATA), 2,2',7,7'-tetrakis(2,2-diphenylvinyl)-9,9-spirobifluorene (Spiro-DPVBi), 4,4'-bis(2,2-diphenylvinyl) biphenyl (DPVBi), (8-quinolinlato)aluminum (Alq), tris(8-quinolinolato)aluminum (Alq3), tris(4-methyl8quinolinolato)aluminum (Almq3), and derivatives thereof; and (4) at least one kind of polymer compound selected from the group consisting of poly(p-phenylenevinylene) (PPV), polymers containing biphenyl groups, polymers having dialkoxy groups, alkoxyphenyl-PPV, phenyl-PPV, pheny/dialkoxy-PPV copolymer, poly(2-methoxy-5-(2'-ethylhexyloxy)-1,4-phenylenevinylene) (MEH-PPV), poly(ethylenedioxythiophene) (PEDOT), poly(styrenesulfonic acid) (PSS), poly(aniline) (PANI), poly(N-vinylcarbazole), halogenated poly(N-vinylcarbazole), poly(vinylpyrene), poly(vinylanthracene), pyrene formaldehyde resin, ethylcarbazole-formaldehyde resin, and modifications thereof.

8. The FET of claim 1, wherein said gate, said dielectric layer, said first and second electrode are all optically transparent.

9. The FET of claim 1, wherein said second electrode comprises a contiguous metallic film.

10. The FET of claim 1, wherein said second electrode comprises a contiguous semiconducting film.

11. The FET of claim 1, wherein said second electrode comprises a plurality of semiconducting nanowires.

12. The FET of claim 1, wherein said first electrode comprises a thin layer of patterned metallic electrodes.

13. The FET of claim 1, wherein said semiconducting active layer comprises amorphous silicon.

14. The FET of claim 1, wherein said first and second electrodes are individual nanotubes directly contacted by a metal contact, whereby minimal size transistor elements are formed.

15. The FET of claim 1, wherein all layers of said FET are flexible.

16. The FET of claim 2, wherein said nanotubes comprising layer comprises primarily SWNTs.

17. The FET of claim 15, further comprising a flexible substrate, wherein said FET is formed on said substrate.

18. A vertical field effect transistor (FET), comprising:
a stack comprising a gate electrode and a first electrode layer having a dielectric layer interposed therebetween, said first electrode comprising a thin layer of patterned metallic electrodes;
a semiconducting active layer electrically coupled to said first electrode, said active layer together with said dielectric layer sandwiching at least a portion of said first electrode, said active layer extending beyond an area of said first electrode to form at least one unshielded active portion, said unshielded portion in direct physical contact with said dielectric layer; and a second electrode layer electrically coupled to said active layer, wherein said second electrode is disposed on at least a portion of said unshielded portion of said active layer, and wherein said second electrode is dilute and electrically percolating.

* * * * *

UNITED STATES PATENT AND TRADEMARK OFFICE
CERTIFICATE OF CORRECTION

PATENT NO. : 8,217,386 B2
APPLICATION NO. : 12/305409
DATED : July 10, 2012
INVENTOR(S) : Andrew G. Rinzler, Zhuangchun Wu and Bo Liu It is certified that error appears in the above-identified patent and that said Letters Patent is hereby corrected as shown below:

Column 1,
Line 63, "or Elm" should read --or film--.

Column 2,
Line 62, "portion the first" should read --portion of the first--.

Column 3,
Line 46, "folmaldehyde" should read --formaldehyde--.
Line 47, "folmaldehyde" should read --formaldehyde--.

Column 5,
Line 12, "palladiun" should read --palladium--.

Column 6,
Line 13, "transistor-elernent" should read --transistor-element--.

Column 7,
Lines 48-49, "flnction" should read --function--.

Column 8,
Line 9, "fuinctions" should read --functions--.
Line 34, "compound" should read --compounds--.
Line 61, "folmaldehyde" should read --formaldehyde--.
Line 62, "folmaldehyde" should read --formaldehyde--.

Column 9,
Line 19, "SWAT film" should read --SWNT film--.

Signed and Sealed this
Twenty-fifth Day of September, 2012

David J. Kappos
*Director of the United States Patent and Trademark Office*

Column 11,
Line 14, "2,2\7,7'-tetrakis" should read --2,2'7,7'-tetrakis--.
Lines 19-20, "9,9-spirobifluorene" should read --9,9'-spirobifluorene--.
Line 33, "pyrene formaldehyde" should read --pyrene-formaldehyde--.